United States Patent
Dames

(10) Patent No.: US 7,026,745 B2
(45) Date of Patent: Apr. 11, 2006

(54) PIEZOELECTRIC ACTUATOR

(75) Inventor: Andrew Nicholas Dames, Cambridge (GB)

(73) Assignee: Polatis Limited, (GB)

( * ) Notice: Subject to any disclaimer, the term of this patent is extended or adjusted under 35 U.S.C. 154(b) by 0 days.

(21) Appl. No.: 10/480,519

(22) PCT Filed: Jun. 19, 2002

(86) PCT No.: PCT/GB02/02826

§ 371 (c)(1),
(2), (4) Date: Jul. 8, 2004

(87) PCT Pub. No.: WO02/103816

PCT Pub. Date: Dec. 27, 2002

(65) Prior Publication Data

US 2004/0251771 A1    Dec. 16, 2004

(30) Foreign Application Priority Data

| Jun. 20, 2001 | (GB) | ................................ 0115067 |
| Jun. 20, 2001 | (GB) | ................................ 0115068 |
| Jul. 5, 2001 | (GB) | ................................ 0116245 |
| Jun. 6, 2002 | (GB) | ................................ 0213020 |

(51) Int. Cl.
*H01L 41/08*    (2006.01)

(52) U.S. Cl. ...................................... 310/328; 310/366
(58) Field of Classification Search ................ 310/328, 310/366, 358, 323, 359; H01L 41/08
See application file for complete search history.

(56) References Cited

U.S. PATENT DOCUMENTS

| 5,027,028 A | * | 6/1991 | Skipper .................... 310/328 |
| 5,081,391 A | * | 1/1992 | Owen ........................ 310/328 |
| 5,122,700 A | * | 6/1992 | Tamai et al. ........... 310/323.15 |
| 5,345,137 A | * | 9/1994 | Funakubo et al. ..... 310/323.16 |
| 6,066,911 A | | 5/2000 | Lindemann et al. |
| 6,359,370 B1 | | 3/2002 | Chang |

FOREIGN PATENT DOCUMENTS

EP        725475 A        8/1996

* cited by examiner

*Primary Examiner*—Darren Schuberg
*Assistant Examiner*—Karen Beth Addison
(74) *Attorney, Agent, or Firm*—Galgano & Burke, LLP

(57) ABSTRACT

An actuator comprises a laminate of interleaved layers of electrode plates and piezoelectric material; wherein an upper region (in use) of electrode plates is adapted when energized to effect deflections in up and down directions; a lower region of electrode plates is adapted when energized to effect deflections in up and down directions; and one or more further regions of electrode plates are adapted when energized to effect deflections in left and right directions.

9 Claims, 22 Drawing Sheets

| U/D1 | U/D8 |
| L/R1 | LR8 |
| U/D2 | UD7 |
| L/R2 | LR7 |
| U/D3 | UD6 |
| L/R3 | LR6 |
| U/D4 | UD5 |
| L/R4 | LR5 |
| + | + |
| − | − |
| + | + |
| − | − |
| + | + |

FIGURE 20

PIEZOELECTRIC ACTUATOR

BACKGROUND OF THE INVENTION

The invention relates to devices whose motion is controlled by the contraction or expansion of piezoelectric material.

The primary aim of the current invention is to provide an actuator which can displace in two dimensions.

A further objective of the present invention is to provide an actuator whose configuration is particularly compact.

A further objective of this invention is to provide an actuator which can be repeatedly submitted to motion while remaining accurate and predictable in its motion. It is therefore necessary for the type of actuator disclosed in this invention to be reliable.

An additional objective of the invention is to offer a new approach to the layout of electrodes within the piezo material.

It is a further objective of this invention to provide an actuator whose shape will enable the actuator to be easily incorporated into a stack of similar actuators. It is therefore a further objective of this invention to present a grouping of actuators which is particularly compact and equally reliable as individual actuators designed to operate in isolation.

SUMMARY OF THE INVENTION

In a first broad independent aspect, the invention is embodied in an actuator comprising a laminate of interleaved layers of electrode plates and piezoelectric material; wherein an upper (in use) region of electrode plates is adapted when energised to effect deflections in up and down directions; a lower region of electrode plates is adapted when energised to effect deflections in up and down directions; and one or more further regions of electrode plates are adapted when energised to effect deflections in left and right directions.

The above configuration is particularly advantageous because it permits the deflection of the actuator in both the X and Y directions which are orthogonal to the Z direction (the Z axis being the one that extends along the length of the actuator). This combination of features is also particularly advantageous because it presents an actuator which will bend in two dimensions with an increased free end swing while being of particularly compact general dimensions.

In a subsidiary aspect in accordance with the first broad independent aspect of the invention, the electrode plates of the or each of said further regions extend essentially parallel to the electrode plates of the upper and lower regions, the electrode plates adapted to conduct the left bias energising voltage being spaced from the electrode plates adapted to conduct the right bias energising voltage whilst their corresponding electrode plates extend essentially across the width of the actuator.

This particular combination of features is particularly advantageous because it presents an actuator susceptible of bending in two dimensions and can achieve a high degree of deflection for the energy applied to the system. This configuration is also particularly compact.

In a further subsidiary aspect according to the first broad independent aspect, the actuator is of a general cylindrical form.

This aspect is advantageous because it maximises the achievable swing when the actuator bends under the application of a particular drive signal. Furthermore, actuators of a general cylindrical form are advantageous because they are particularly well adapted to form a compact array when operating alongside other similar actuators.

In an additional subsidiary aspect, the actuator comprises one or more tunnels.

The provision of one or more tunnels is particularly advantageous because they can accommodate elongate elements such as optical fibres. Once these elongate elements are inserted in these tunnels they can deflect together with the actuator while the actuator can constitute a protective housing for these elements.

In a further subsidiary aspect in accordance with the first broad independent aspect of the invention, the or each strip of piezoelectric material has a thickness within the range of approximately 20 to approximately 35 microns.

Selecting the strip of piezoelectric material to be within this particular range is advantageous because the bending which can be achieved within that range is maximised while remaining controllable and reliable in the long term.

In a further subsidiary aspect according to the first broad independent aspect of this invention, the or each electrode has a thickness of approximately 2.5 microns.

At this thickness, the bending of the actuator is maximised while remaining controllable and reliable in the long term.

In a second broad independent aspect the invention provides an actuator in the form of a comb incorporating two or more teeth, one or more of which comprise a laminate of interleaved layers of electrode plates and piezoelectric material; wherein an upper (in use) region of electrode plates is adapted when energised to effect deflections in up and down directions; a lower region of electrode plates is adapted when energised to effect deflections in up and down directions; and one or more further regions of electrode plates are adapted when energised to effect deflections in left and right directions.

One of the advantages of arranging a group of teeth of the kind in question in the form of a comb is that a large number of angular positions can be achieved at one given time. At least one of the teeth if not all of them can be individually displaced in two dimensions.

Other advantages of this configuration are that the teeth will be particularly straight forward to control, while each achieve great end point deflections and will be susceptible of achieving accurate angular positioning over an extended period of time. A group of teeth of this kind can also readily be manufactured at a lower cost than producing an array of individual teeth. Another advantage of producing the actuator as a comb of teeth is that this configuration is particularly compact and can easily be adapted to operate in combination with other combs of a similar structure to produce a larger array of teeth which will also be compact overall.

BRIEF DESCRIPTION OF THE DRAWINGS

FIG. 20 shows the output surrounding the outside edge of the comb as shown in FIG. 18.

DETAILED DESCRIPTION OF THE DRAWINGS

Figure 1:
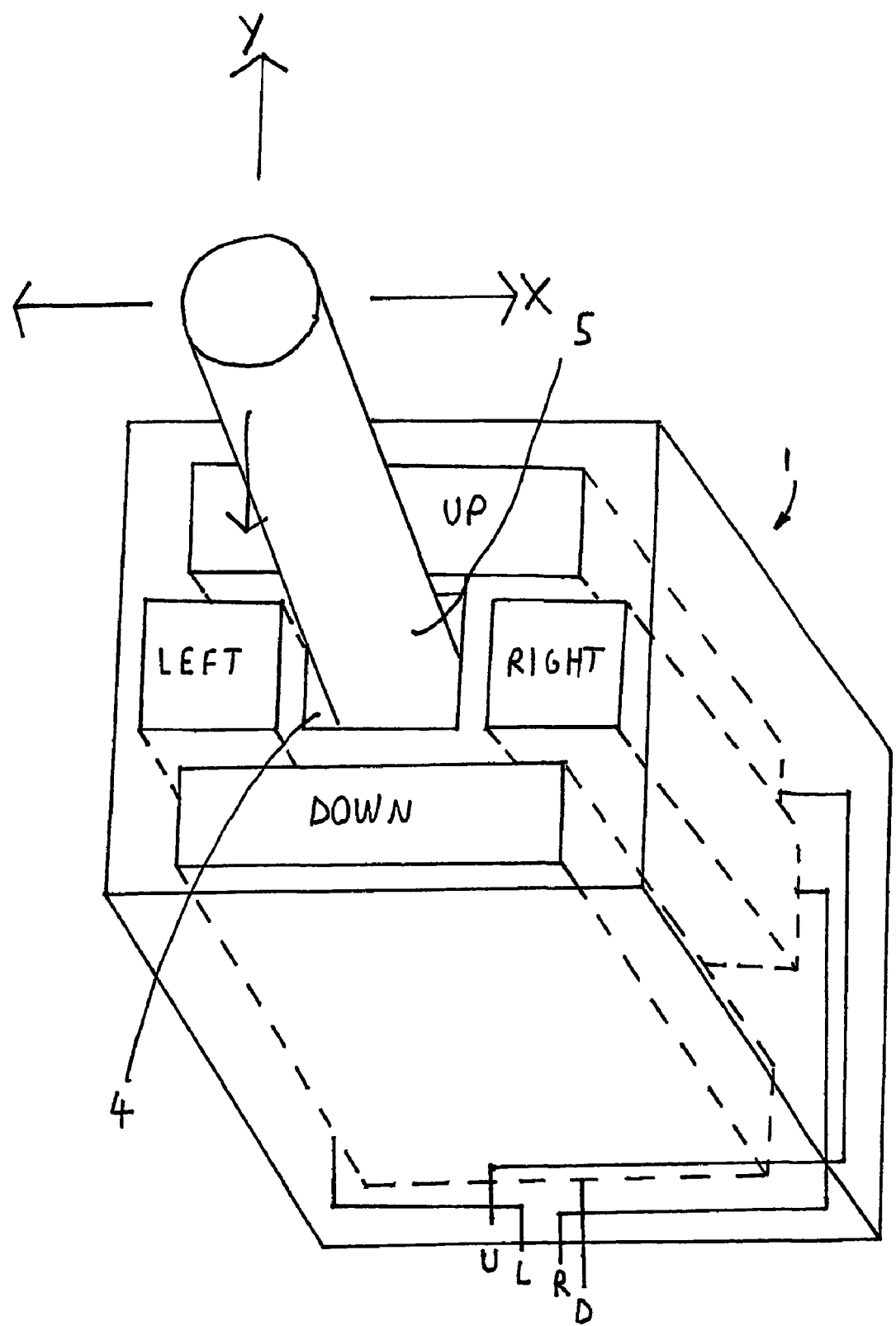
FIG. 1 is a schematic of the actuator.

FIG. 1 is a schematic of a 2D actuator shown generally at 1. The actuator is essentially a cylindrical piezoelectric actuator with a square cross section and having in this embodiment an axial bore 4 to accommodate an elongate element 5 such as an optical fibre. The electrodes are positioned within the body of the piezoelectric material in four separate regions designated UP, DOWN, LEFT and RIGHT. Each of these groups of electrodes can be individually stimulated, for example if only UP is stimulated the top part of the actuator will contract and consequently the actuator will bend towards the contracting part which will move the elongate element with which the piezoelectric actuator is operating. The electrodes are stimulated by the inputs U, L, R and D which correspond to UP, LEFT, RIGHT AND DOWN respectively. In order to capitalise on the fact that the actuator extends primarily in the Z direction and therefore only occupies a limited space in the X and Y directions, the electrodes inputs may be all positioned on the same side of the actuator.

The respective electrodes preferably extend over the whole length of the actuator. However, these may alternatively only stimulate a section of the actuator.

Figure 2:
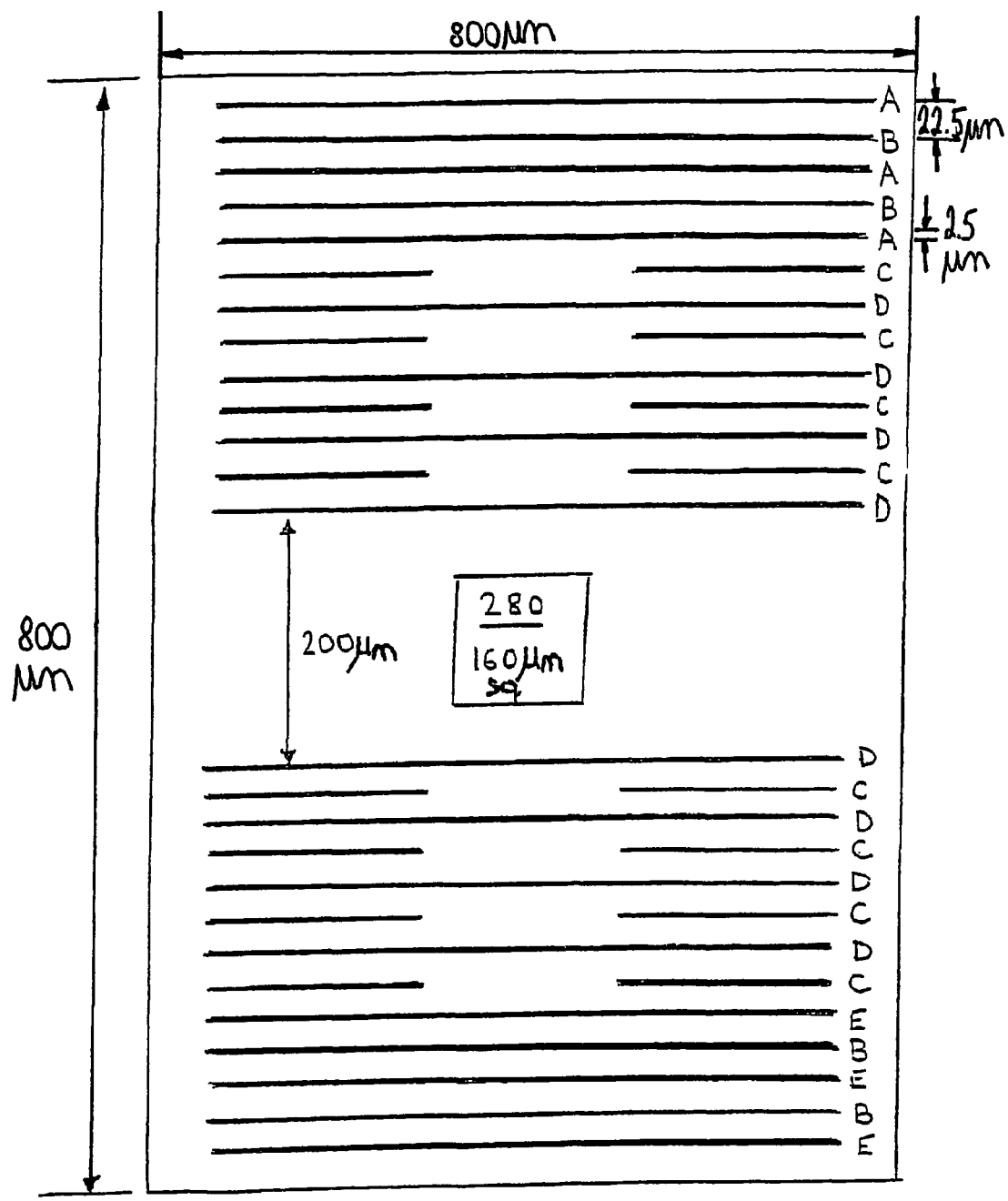
FIG. 2 presents a schematic cross-sectional view of one embodiment of the actuator.

FIG. 2 is the diagrammatic representation of the cross-section of a specific and preferred monolithic type piezoceramic block whose method of manufacture will be explained in detail at a later stage in this application.

Towards the top of the actuator structure, there are interleaved electrode layers A and B, extending across the width of the block. There are similar electrode layers E and B towards the bottom of the block. With all the B layers conveniently grounded, the application of a voltage to either A or E, will cause upward or downward movement, respectively. In this scheme, the driver voltages are uni-polar and the polarisation is aligned parallel with tile applied field such that the piezoelectric material reacts in contraction mode.

In the middle region of the block are interleaved electrode layers of C and D. The D layers extend across the width of the block, whilst the C electrodes are divided into left and right. Application of a voltage to the appropriate set of C electrodes will effect left or right deflection.

The particular dimensions of the piezoelectric actuator of this embodiment have been written into FIG. 2. The layers of soft PZT material measure 22.5 µm in thickness while the electrodes themselves have a thickness of 2.5 µm. A central section is deprived of electrodes for a thickness of 200 µm in order to accommodate a central bore of 160 µm square. There has also been provided a centre gap in between the left and right bias electrodes of approximately 0.2 mm.

Figure 3:
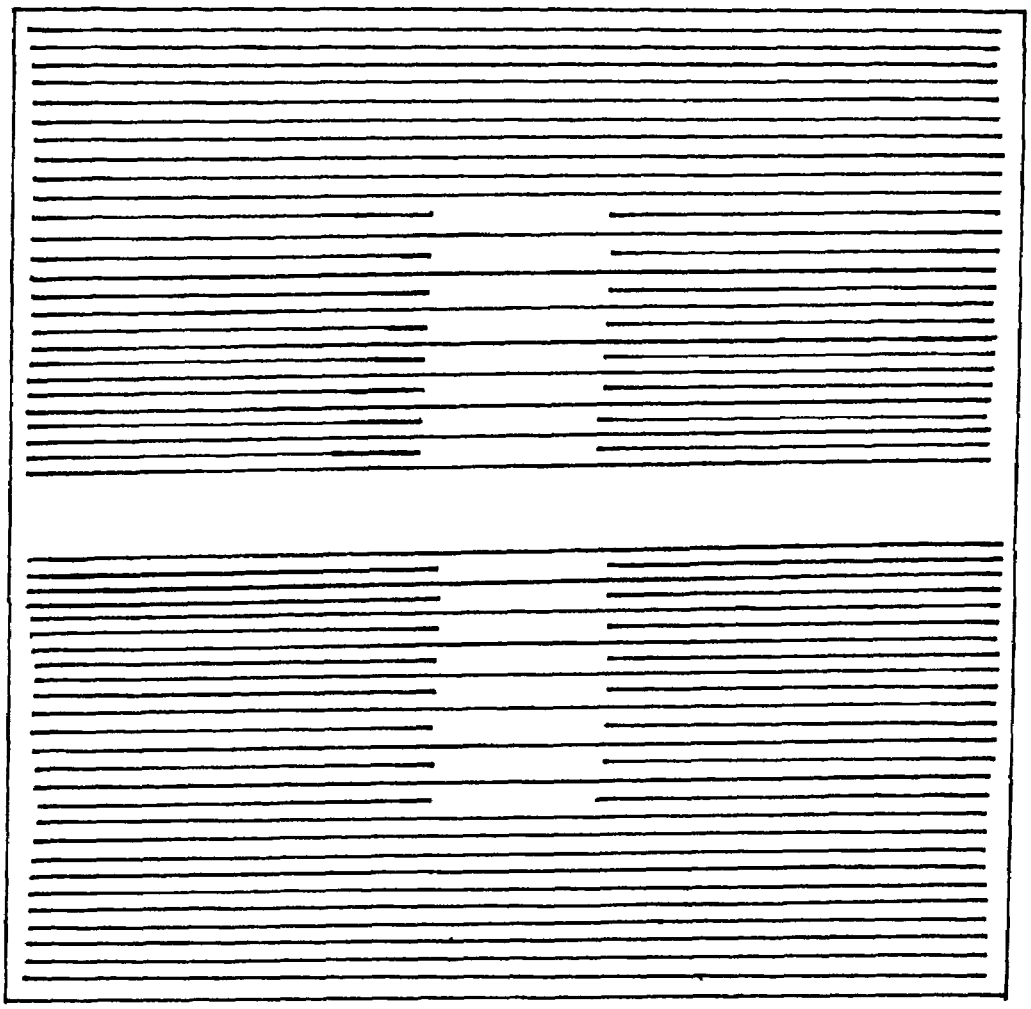
FIG. 3 shows a schematic cross-sectional view of a further embodiment of the actuator.
Figure 4:
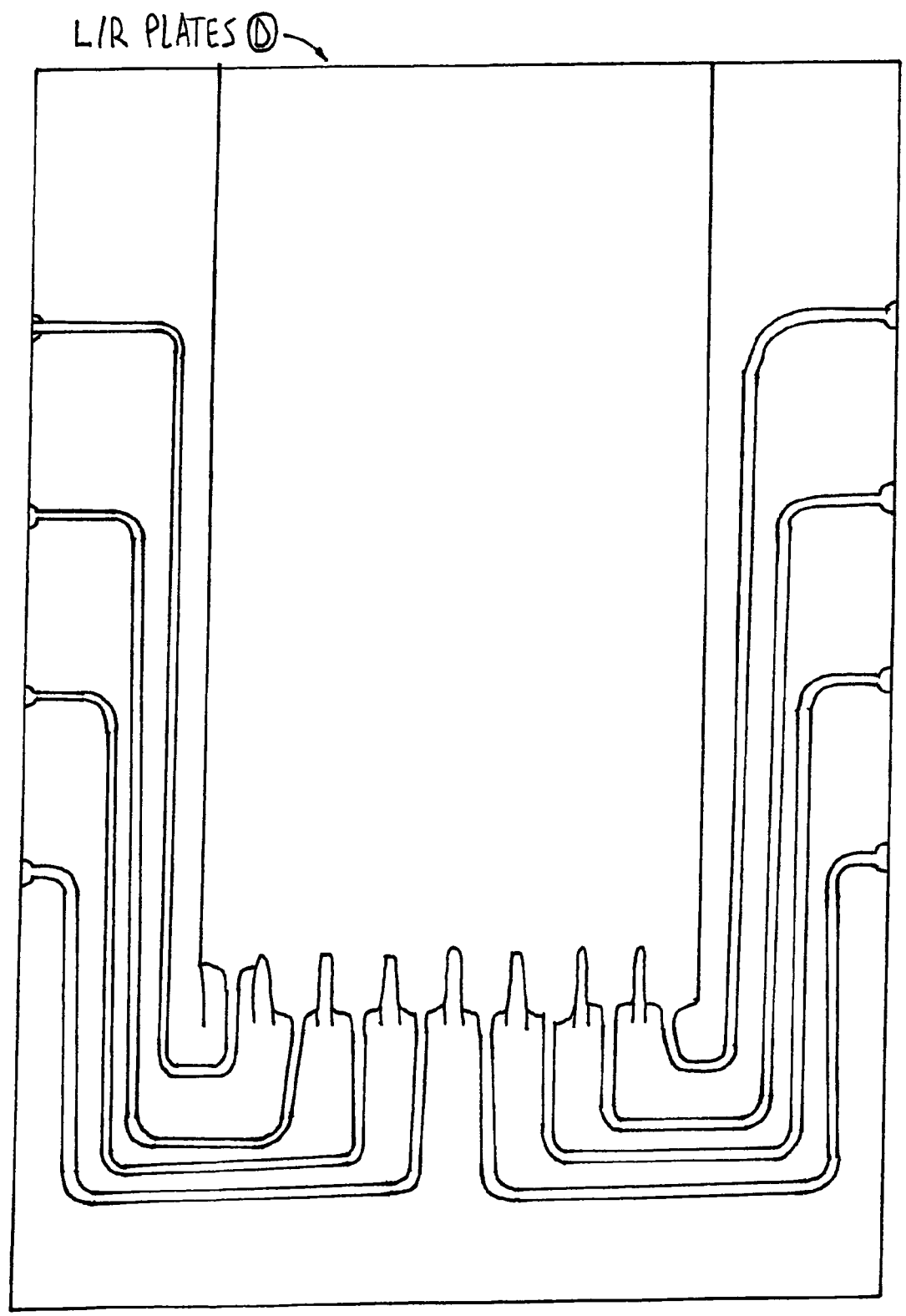
FIG. 4 shows the left (L)/right (R) electrode plate (D).

FIG. 3 presents a further embodiment of a 2D piezoelectric actuator. This piezoelectric actuator comprises similar interleaved electrodes to that described in the context of FIG. 2. This particular type of piezoelectric actuator has done away with the central bore and therefore enables a more efficient distribution of the electrodes within the piezoceramic. This particular type of piezoelectric actuator is a block of 1.8×1.8 mm and has although not illustrated in this figure an active length of 31 mm and an overall length of 41 mm. There are also 54 layers of 30 µm soft PZT material separated by electrodes of 2.5 µm. The capacitance (U/D) is of 0.3 µF and for (L/R) is 0.7 µF. Each electrode of this configuration has a width of 1.6 mm and a length of 31 mm while extending parallel to each other along that length. The centre gap in the L/R bias electrodes is 0.2 mm. While the operating voltage is +90, −15 V with a bias voltages of +/−37.5 V and drive voltages of +/−52.5 volts. The deflection if the piezo actuator is unloaded is of +/−125 µm for U/D and L/R when one extremity is clamped at approximately +/−0.8 N.

The 2D actuators described above can be isolated units or form part of a toothed actuator comb, each comb tooth having an electrode configuration of the type described above.

In order to manufacture a piezoceramic comb, piezoceramic material such as lead zirconate titanate is layered with electrode plates. As already discussed, when the electrode plates are stimulated with an applied voltage, the piezoceramic material can contract as detailed above or even expand, depending on the bias of the applied voltage. In the cases described above, the voltages are only between 0V and 90V, and hence always positive, and therefore causes the piezoceramic material to contract. And by contracting different sections of piezoceramic material, a different effect is created in the entire piezoelectric actuator.

A particularly advantageous method of producing a group of 2D actuators is to produce them as a comb shape with separately controllable teeth. A preferred method of manufacturing such a comb shape actuator is carried out by producing layered electrode plates measuring the entire size of the actuator area in a largely rectangular shape and then cutting in appropriate locations to obtain the comb shape.

Figure 7:
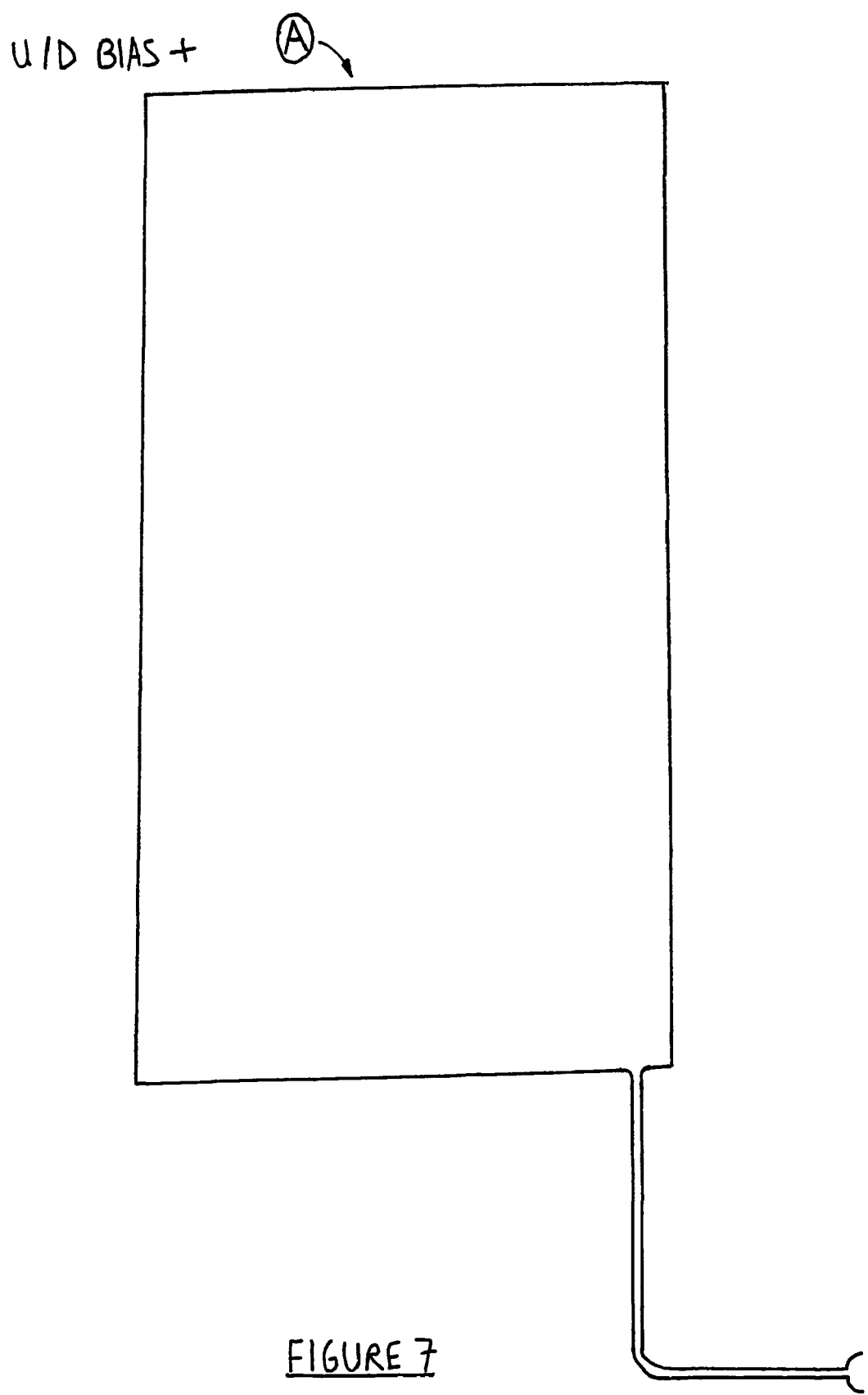
FIG. 7 shows the up (U)/down (D) positive bias plate (A).
Figure 8:
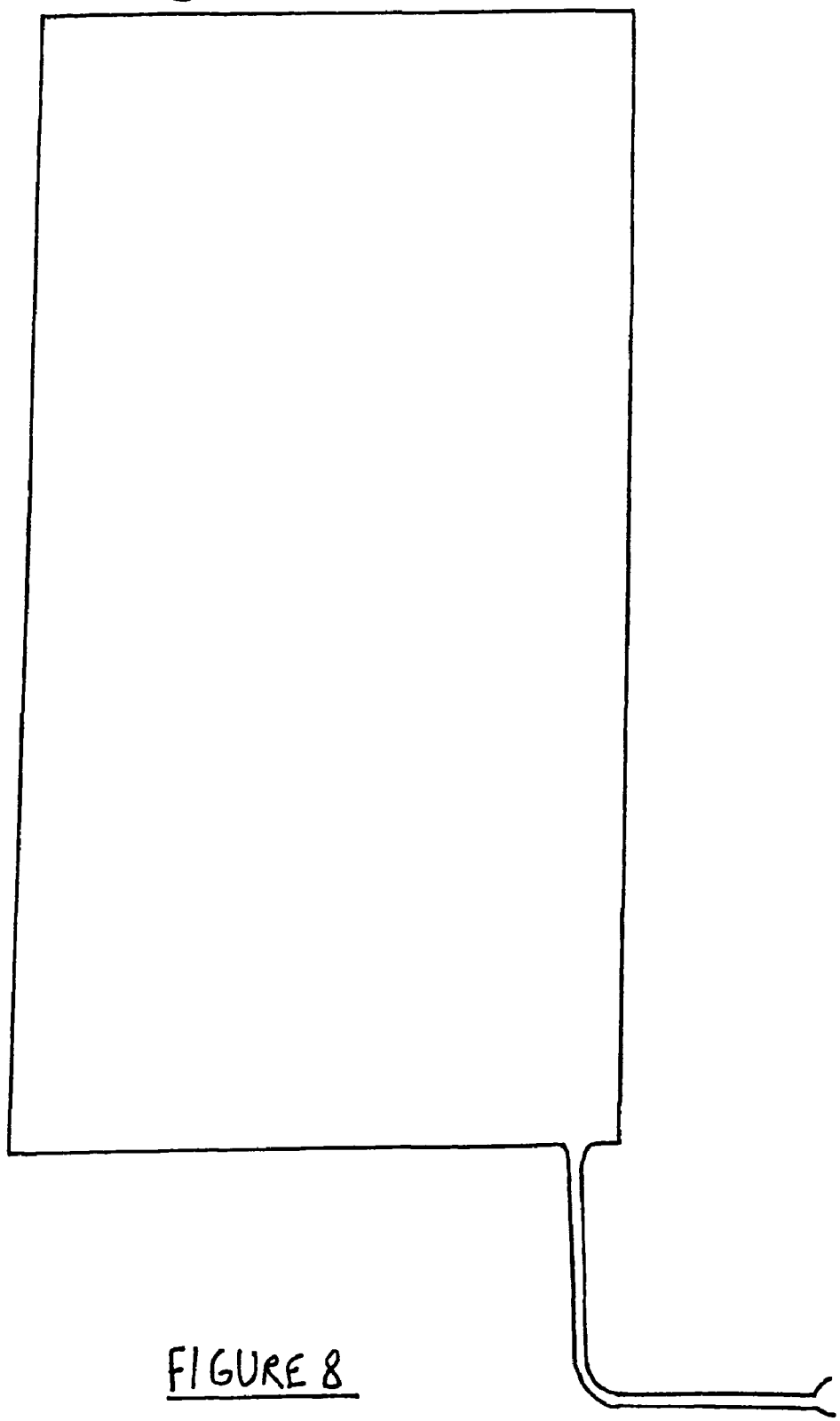
FIG. 8 shows the up (U)/down (D) negative bias plate (E).
Figure 9:
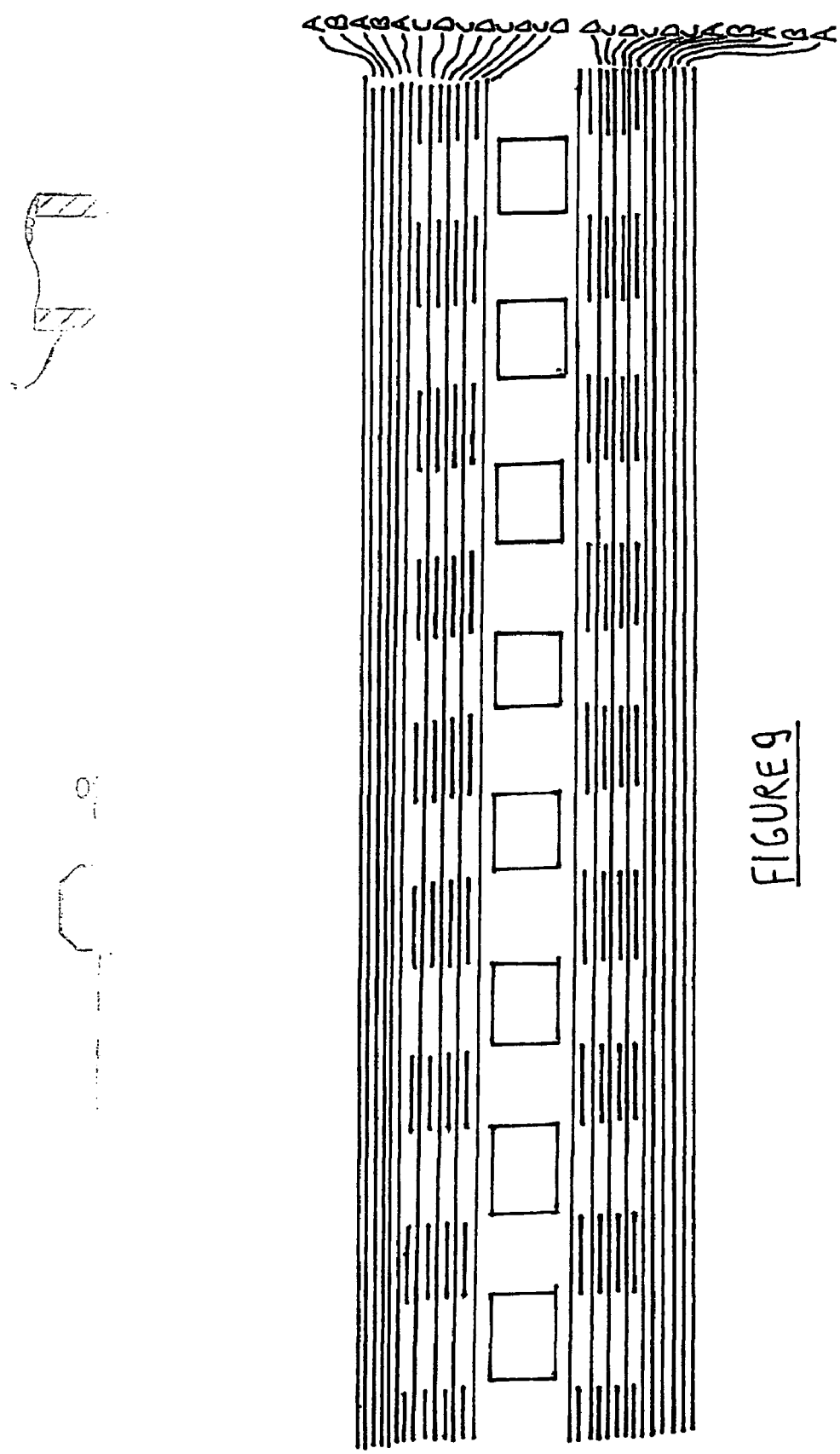
FIG. 9 shows a cross-sectional view of the layout of plates of FIGS. 4–8 (A, B, C, D, E).

The plates are shown in the FIGS. 4, 5, 6, 7 and 8 and are labelled D, C, B, A and E respectively and are layered on top of each other in the sequence shown in FIG. 9. FIG. 9 shows the holes 32 already cut, with the electrodes layered around them. The layers are 22.5 microns ceramic between each 2.5 microns layer of electrode.

Figure 10:
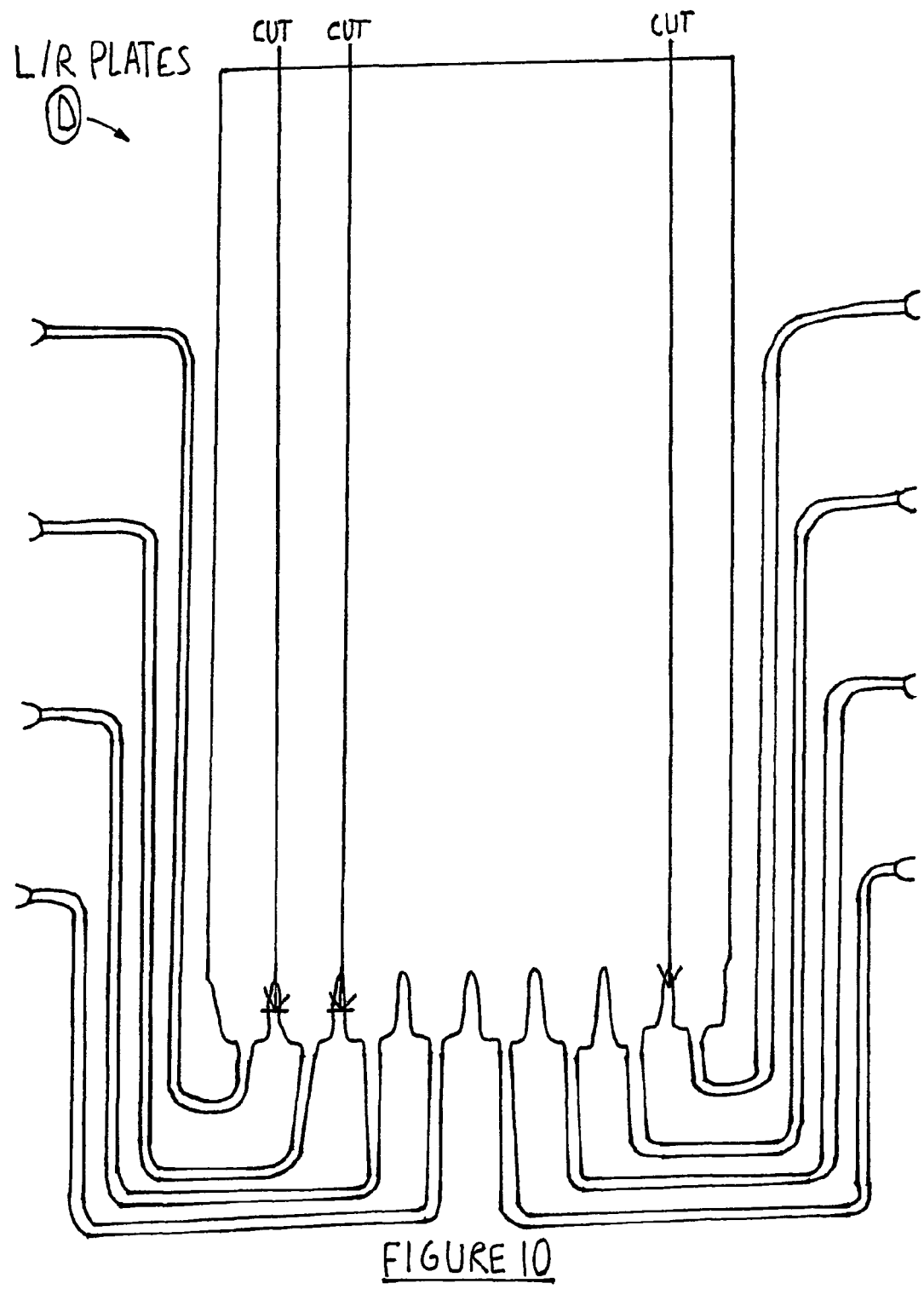
FIG. 10 shows the sawing positions of the left (L)/right (R) electrode plate (D) of FIG. 4.
Figure 12:
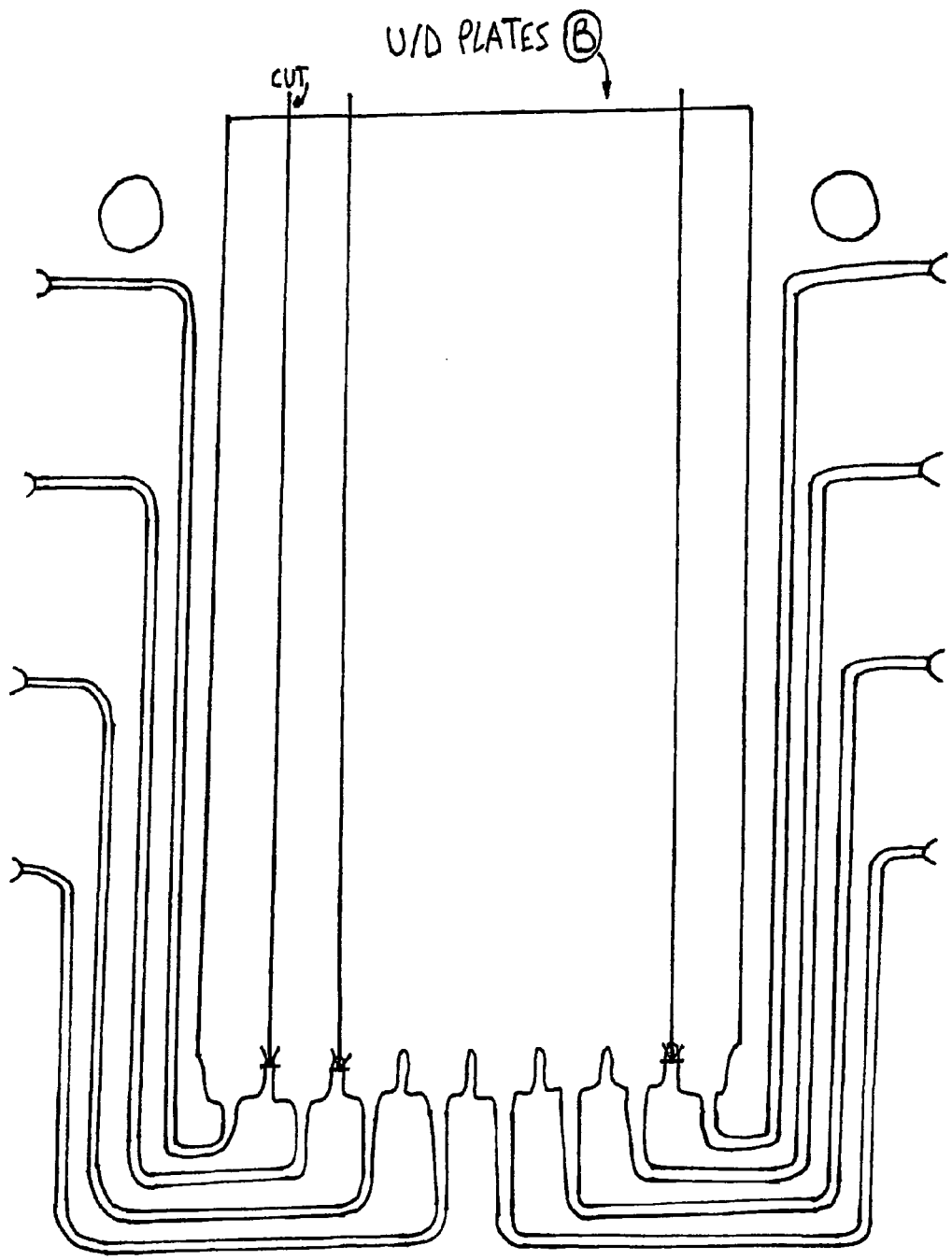
FIG. 12 shows the sawing position for the up (U)/down (D) electrode plate (B) of FIG. 6.

Though there are 5 different plates, there are 3 different types of plates. It can be seen from FIGS. 4 and 6 that plates D and B are similar in that they both have an input for each eventual tooth (as can be seen in FIGS. 10 and 12) and each tooth can therefore be stimulated independently.

Figure 5:
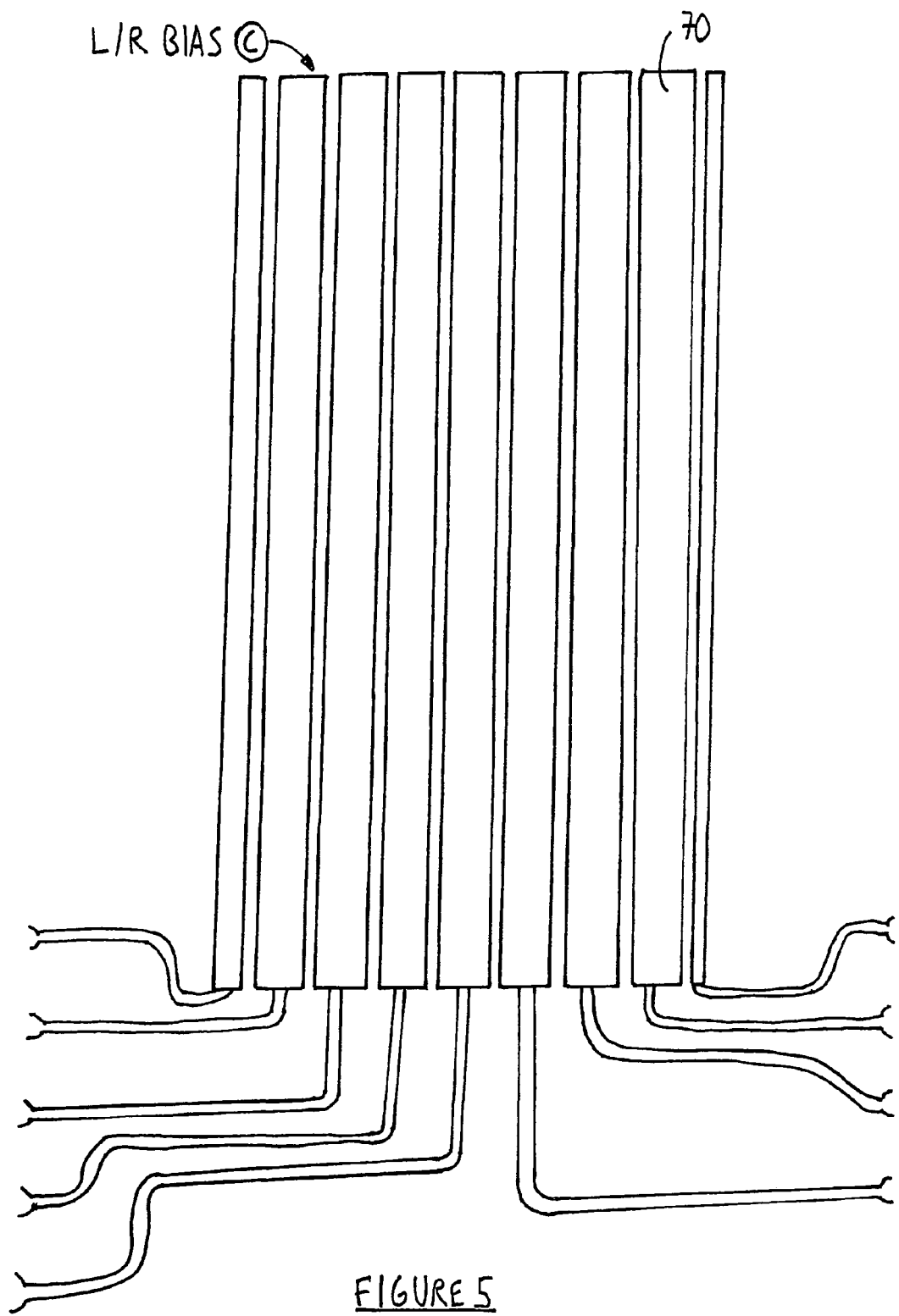
FIG. 5 shows the left (L)/right (R) bias plate (C).
Figure 6:
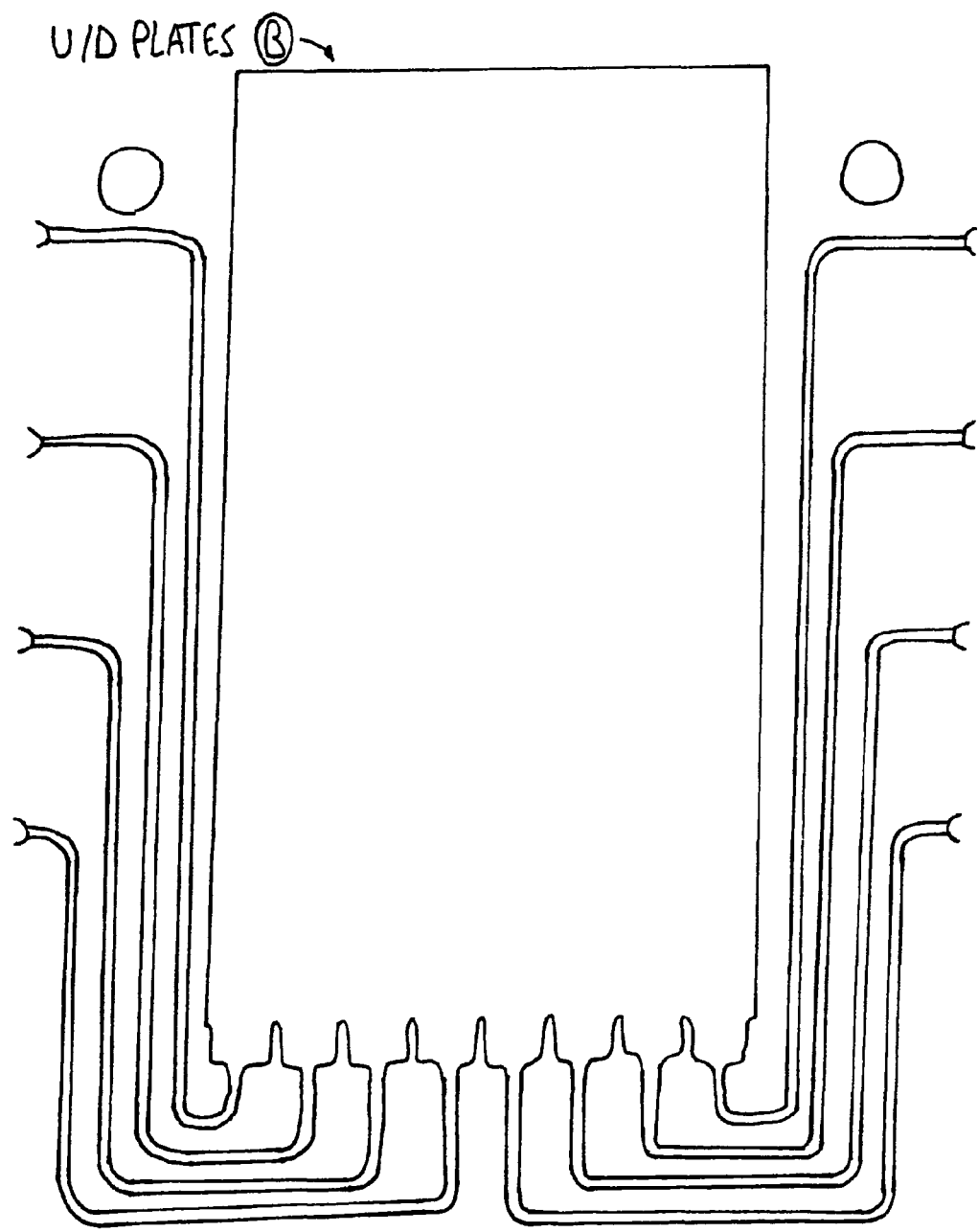
FIG. 6 shows the up (U)/down (D) electrode plate (B).
Figure 11:
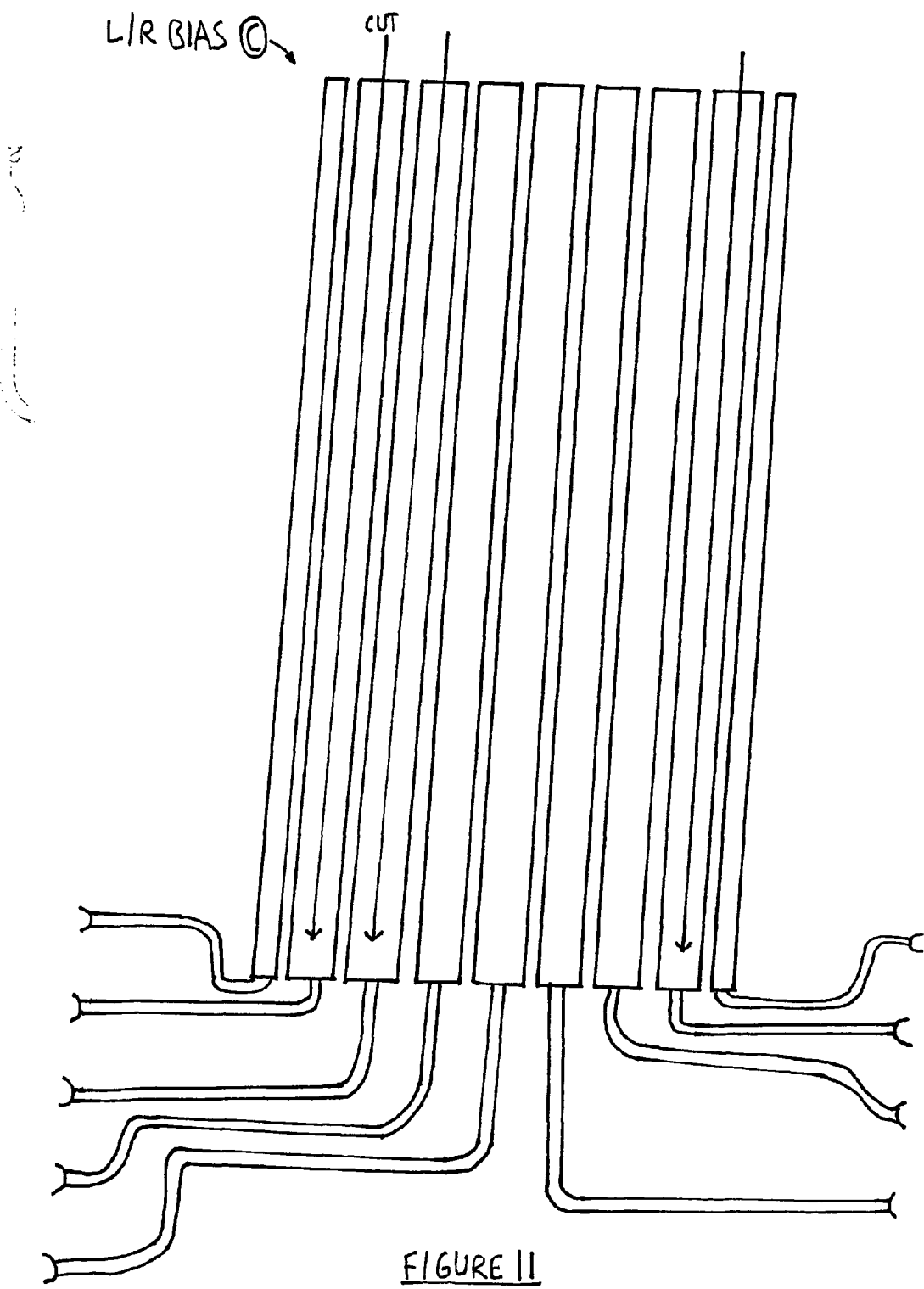
FIG. 11 shows the sawing position for the left (L)/right (R) bias plate (C) of FIG. 5.
Figure 13:
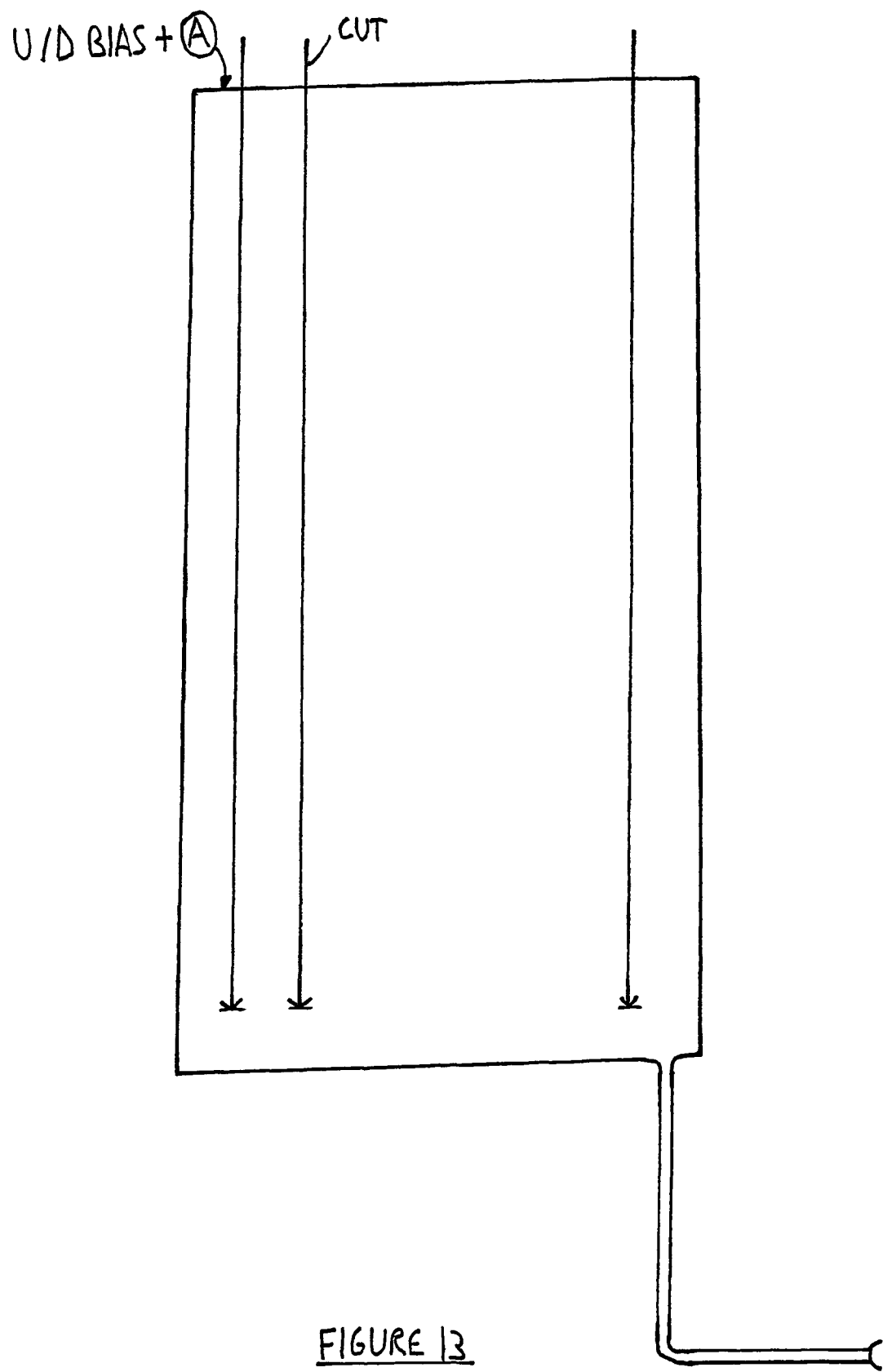
FIG. 13 shows the sawing position for up (U)/down (D)positive bias plate (A) of FIG. 7.
Figure 14:
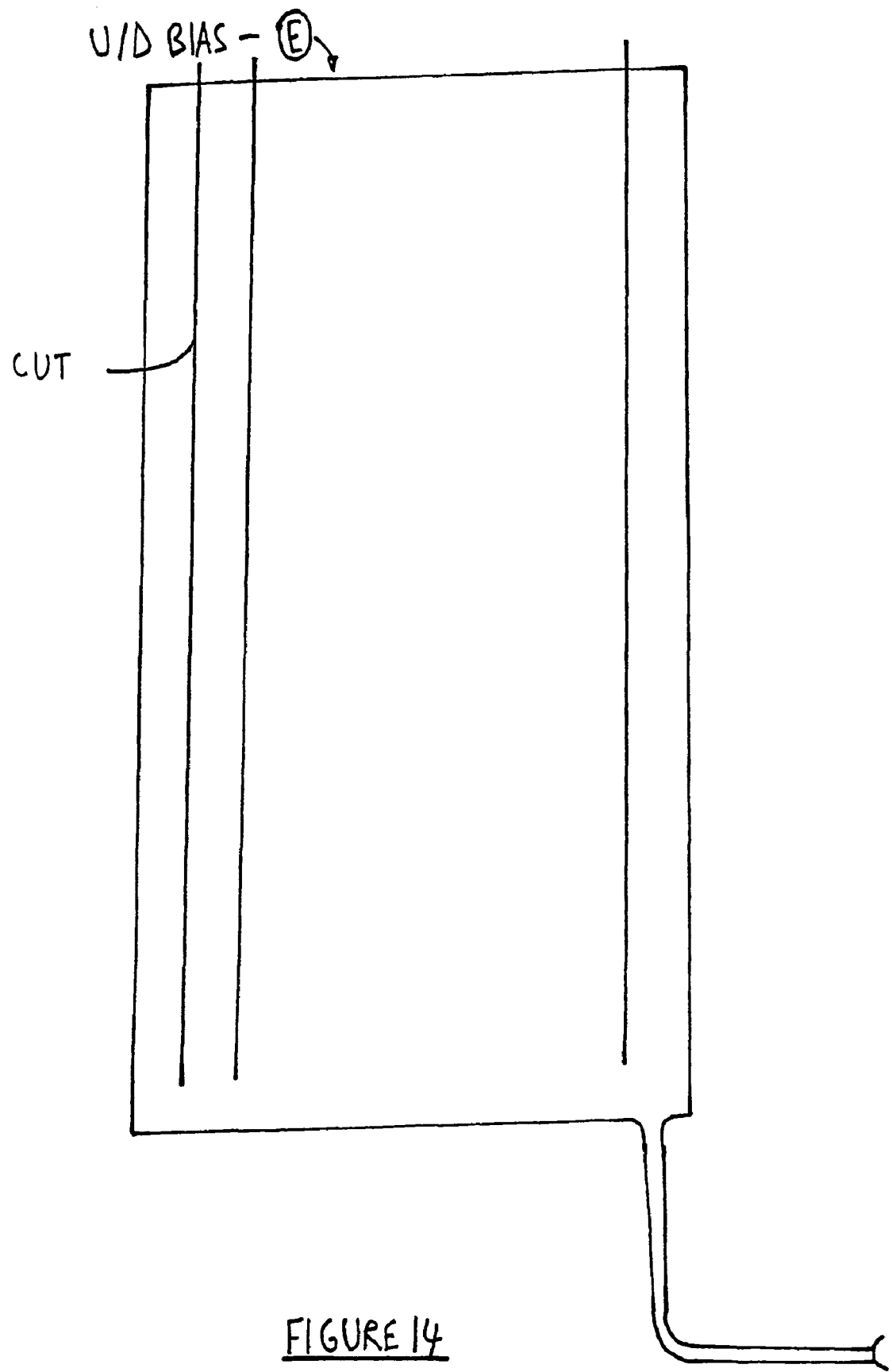
FIG. 14 shows the sawing positions for the up (U)/down (D) negative bias plate (E) of FIG. 8.

Plates A and E of FIGS. 7 and 8 both have only one electrode input and all the A and/or E electrode of the eventual teeth are stimulated at the same time and not independently. The cuts can be seen in FIGS. 13 and 14. The input layout of B is different from that of D; the input layout of A and E are also different The third type of electrode plate is shown in FIG. 5. When the electrodes fingers 70 of plate C (as shown in FIG. 11) are sawn down the middle, the saw cut does not go all the way to the bottom of the electrode material.

The D plate, when a voltage is passed through it, effects the left and right movement of the actuator tooth, if the comb of teeth is viewed from the end from which the fibres emerge and the tooth array runs left to right. The C plate conducts the left/right bias voltage which balances the voltage in plate D. It can be seen that this particular example is for an 8 tooth comb, as there are 8 spaces between electrodes in the C plate. The B plate is similar to plate D, but its positioning make its voltage effect the up and down movement of the actuator tooth. Plate A and E are the positive and negative bias plates for the up/down movement of the actuator tooth respectively.

FIG. 9 shows the layout of the plates as: ABABACDCD-CDCD hole 42 DCDCDCDCABABA.

Other configurations may be possible.

Figure 15:
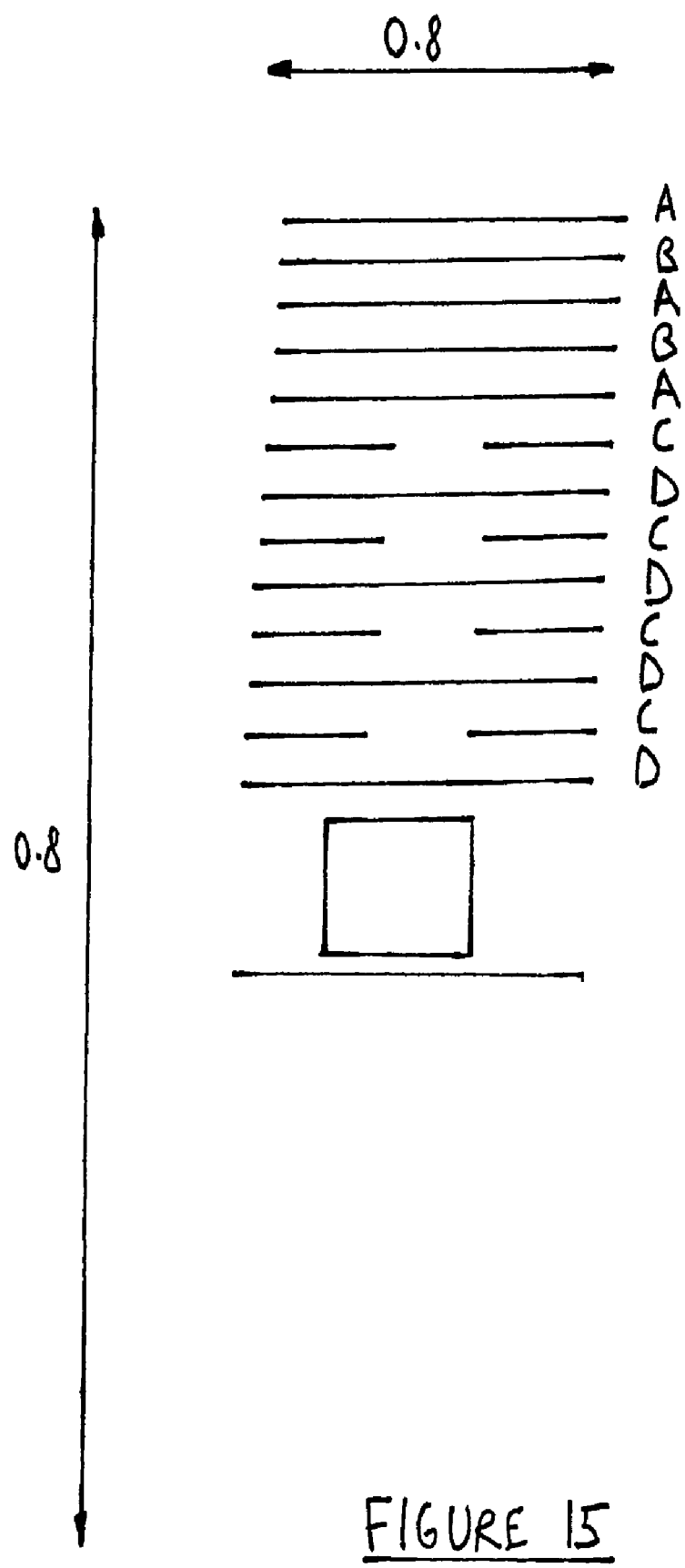
FIG. 15 shows a single cut section of the plate layout of FIG. 9.

FIGS. 10, 11, 12, 13 and 14 show where in the plates some of the saw cuts are made to create the 8 (in this case) separate teeth of the actuator comb. The saw cuts in the plates make a plate configuration in each actuator tooth as shown in that FIG. 15. Each of the cuts are 0.2 mm wide, leaving 0.8 mm of actuator for each tooth.

Figure 16:
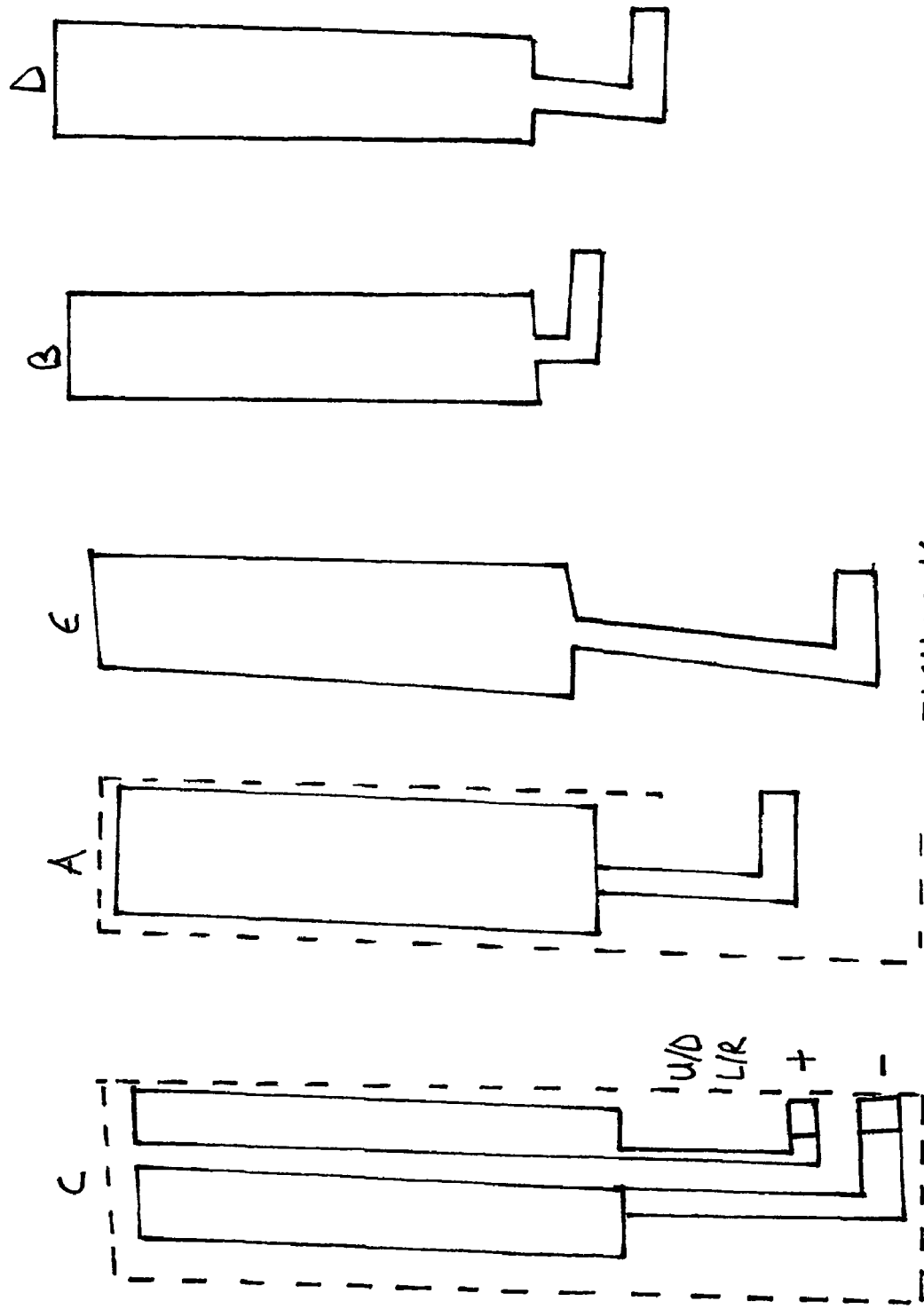
FIG. 16 shows a schematic of the plates separately once they have been sawn.

FIG. 16 shows each of the types of plates after they have been cut, and as they would look separately. A combination of a plurality of all of these cut plates layered with piezoceramic material would make up a single tooth of the actuator comb.

Figure 17:
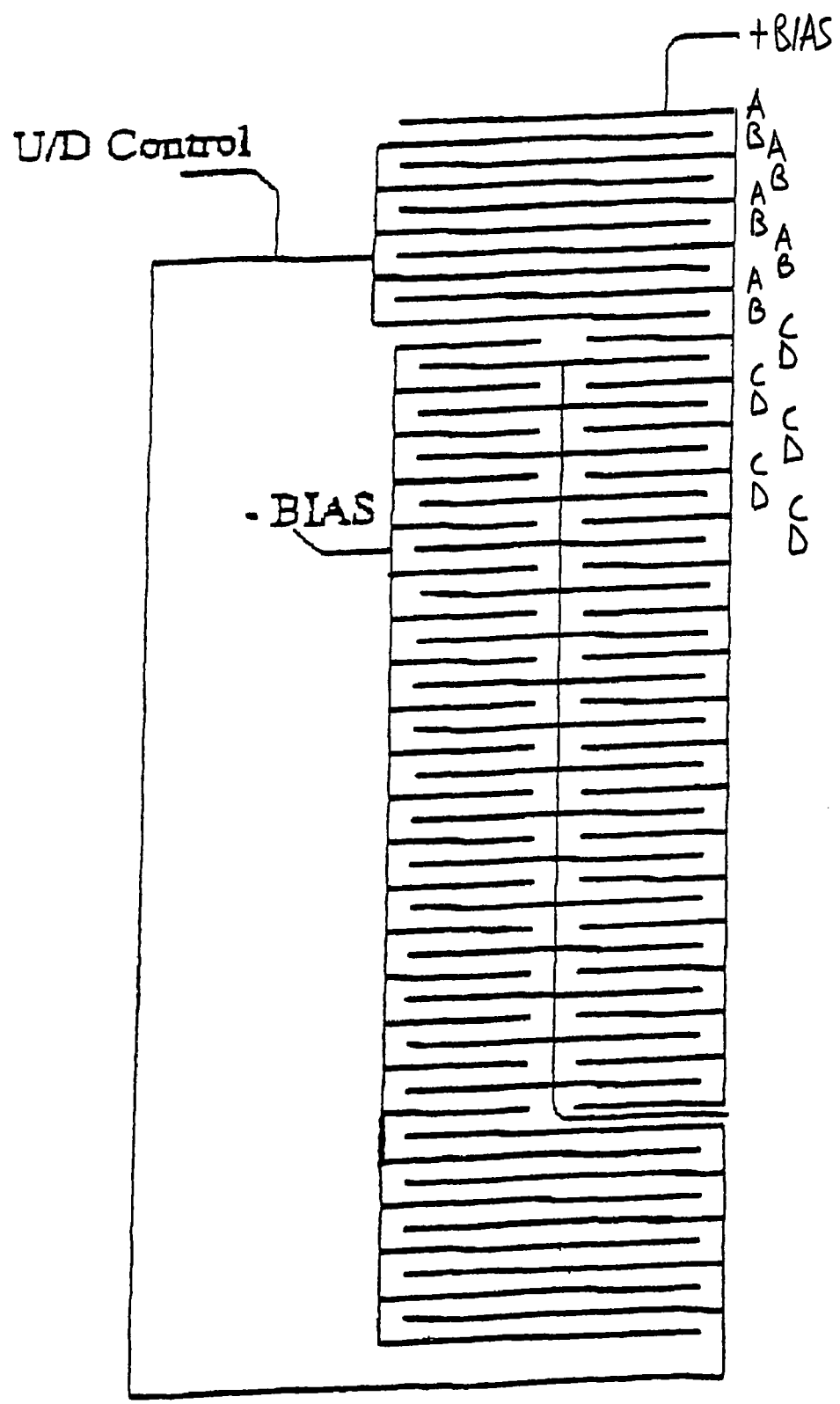
FIG. 17 shows the single cut section of the plate layout as in FIG. 15 but without the hole and showing how each layer is connected.

FIG. 17 shows how the different plates are attached to each other electronically in a single actuator tooth The hole is not shown; it may be bored in later on. Each tooth has 4 electrode inputs; U/D control, L/R control, +bias and −bias.

Figure 18:
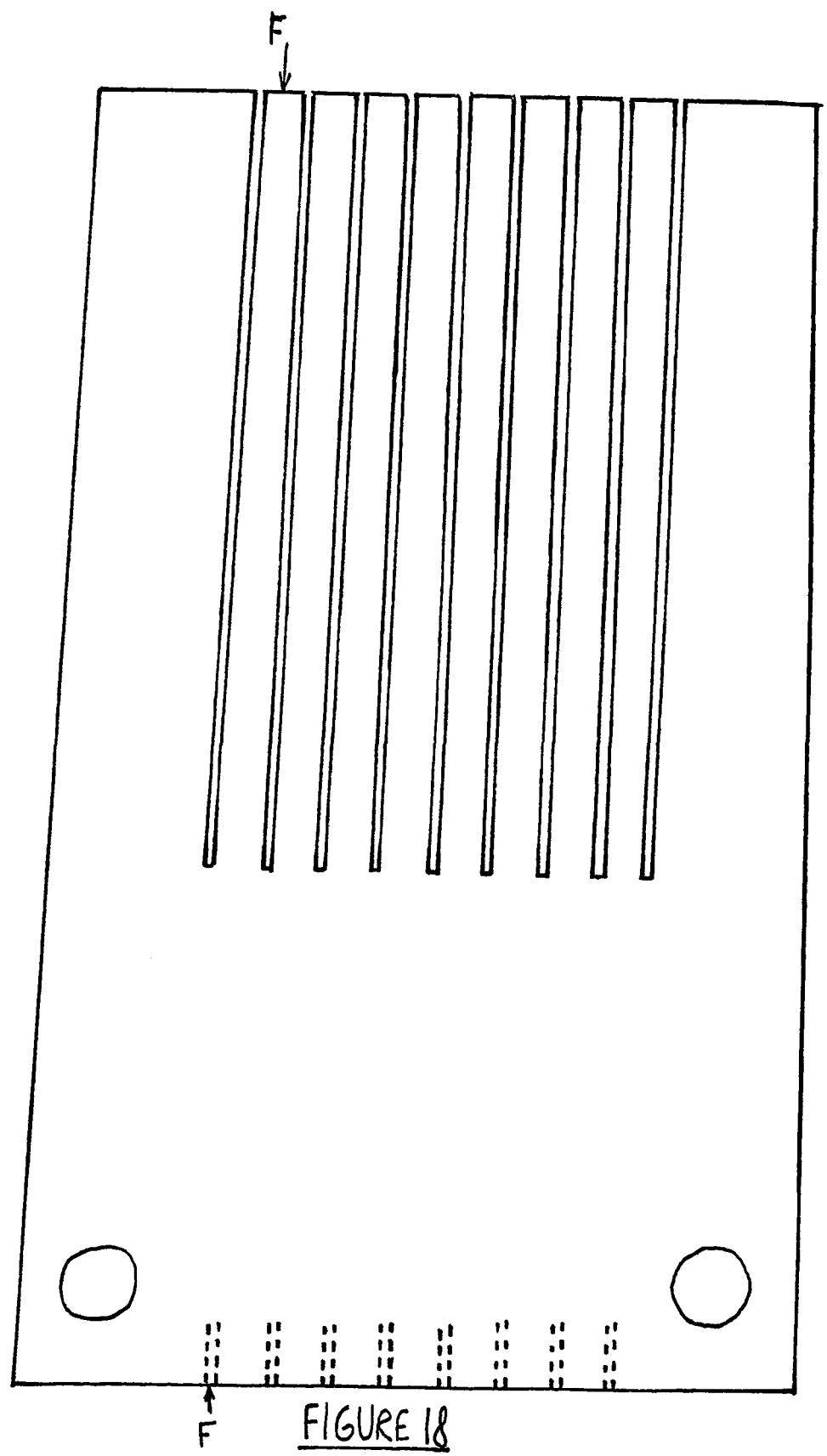
FIG. 18 shows an 8 toothed actuator comb.
Figure 19:
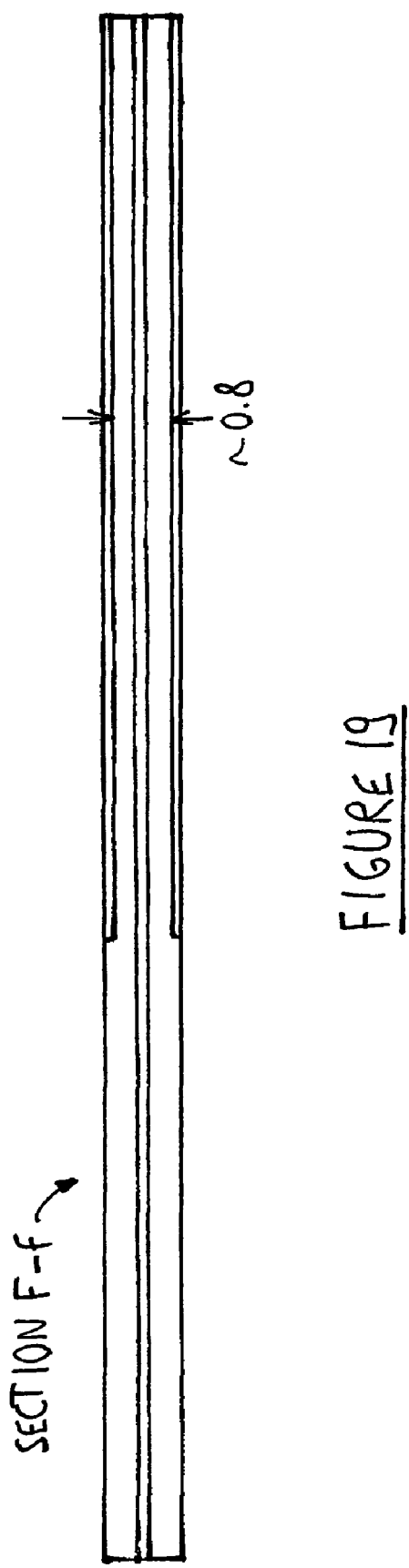
FIG. 19 shows the cross-sectioned slice through F—F of FIG. 18.

FIG. 18 shows an 8 toothed comb actuator structure with 2 points, F, on it FIG. 19 shows the cross-section at the line of F—F of FIG. 43. The bottom of the comb is 1 mm wide, with the cut part at 0.8 mm. This is the side length of each tooth.

FIG. 20 shows the entry points of all the electrode inputs. U/D1 to U/D8 are the up/down inputs for each of the 8 actuator teeth. The notation is similar for the left/right (L/R) electrode inputs. The + and − are bias voltage inputs; 8 inputs for the left/right bias voltage input and one each for the up/down positive and negative bias voltage inputs. It can be seen from FIG. 20 that all of the electrode inputs are on the sides of the comb. This is for ease of handling and to make the entire comb more compact.

Figure 21:
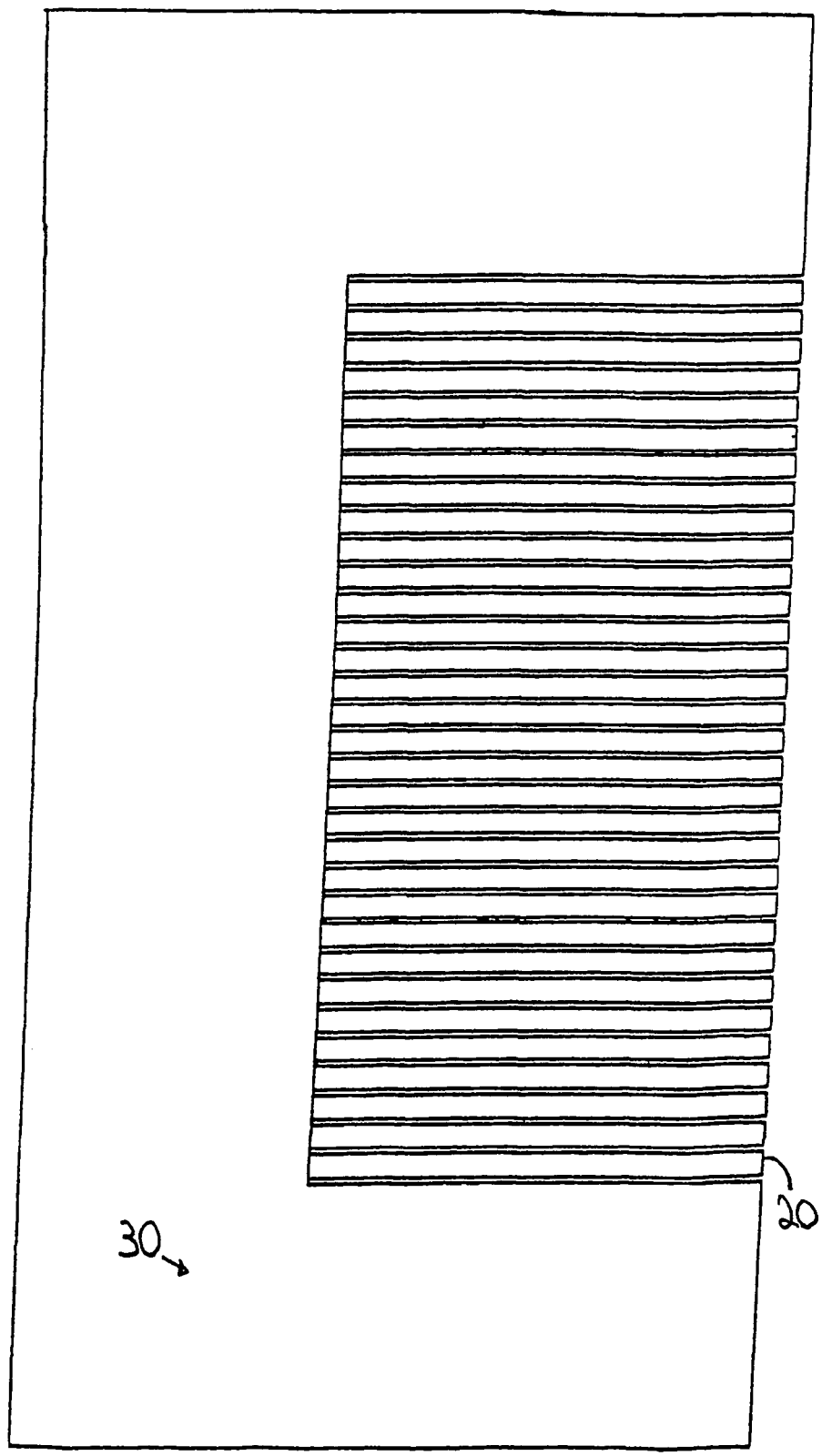
FIG. 21 shows a further embodiment of a comb actuator.

FIG. 21 shows a further embodiment of a monolithic piezoceramic actuator 30 cut in such a way that it resembles a 32—toothed comb; each of the teeth 20 acting as an independent piezoceramic actuator. Each of the teeth 20 of the piezoceramic comb 30 has a hole bored through it through which can be threaded an optical fibre. Combs of this type can be easily stacked to form an array of combs which can be used in an input or output array for an optical system. For example 32 combs of 32 actuator teeth may face 32 combs of 32 teeth, thus making 1,024×1,024 (i.e. 1,024 port) switch.

Figure 22:
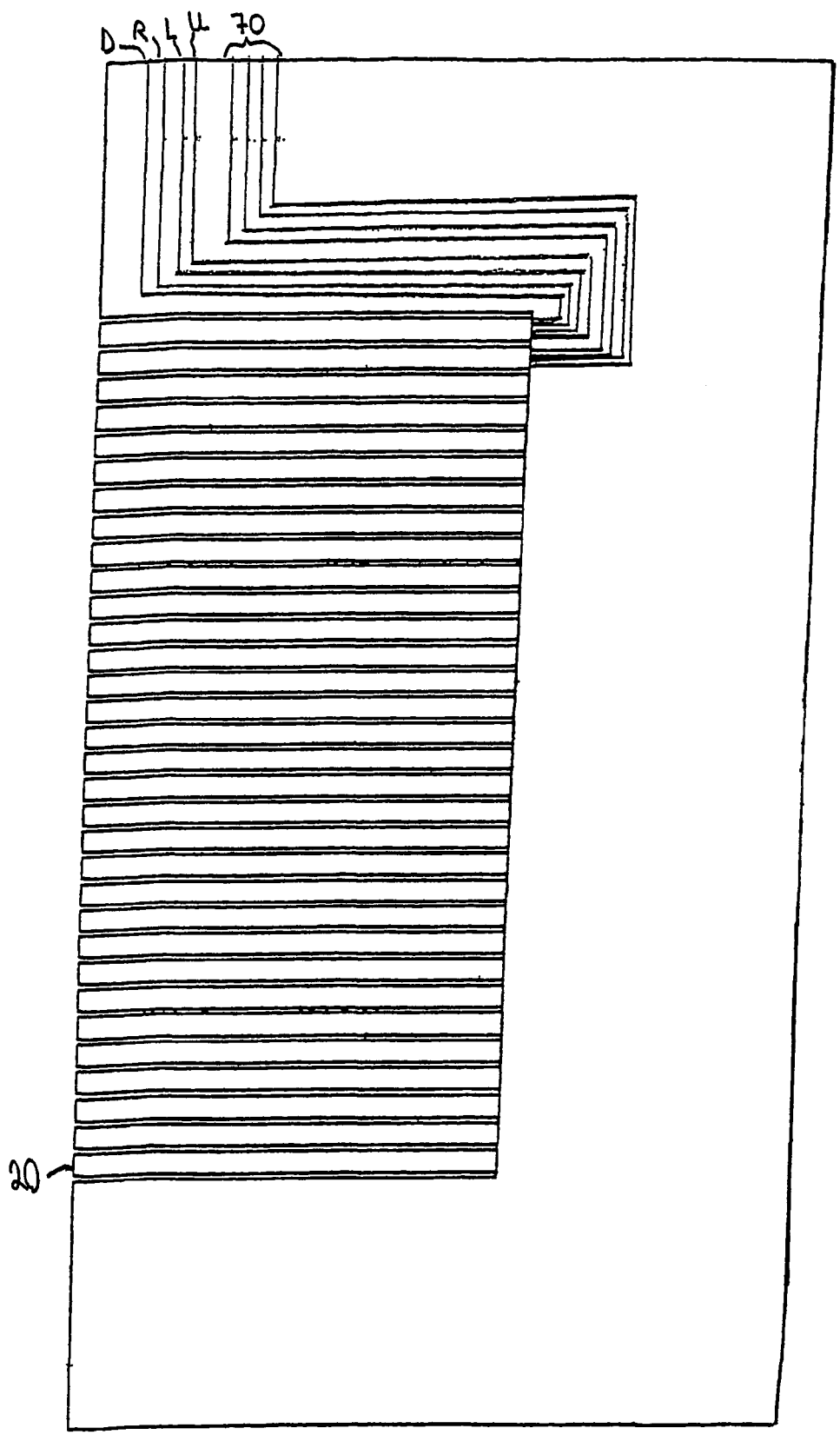
FIG. 22 shows the comb structure and a fraction of its electrode inputs.

FIG. 22 shows the comb structure with some of its electrode inputs. The electrode stimulus inputs 70 are divided into 4 for each comb tooth 20. The input connections are set up so that the separate electrode inputs D, R, L and U emerge around the outside edge of the comb as seen for 2 tooth samples in FIG. 22. In this way, many combs may be stacked in a parallel fashion and all electrode inputs are still readily accessible.

The invention claimed is:

1. An actuator generally extending in the Z direction, comprising: a laminate of interleaved layers of electrode plates and piezoelectric material; a first region of electrode plates; means for energizing said first region to effect deflections in a first Y direction; a second region of electrode plates spaced in essentially the Y direction from said first region; means for energizing said second region to effect deflections in a second Y direction; at least one further region of electrode plates and means for energizing said further region to effect deflections in the X direction.

2. An actuator according to claim 1, wherein said layers extend generally in the Z direction.

3. An actuator according to claim 1, wherein said actuator comprises no central bore.

4. An actuator according to claim 1, wherein said at least one further region of electrode plates is sandwiched between said first and second regions.

5. An actuator according to claim 1, wherein said electrode plates of said at least one further region comprise a first set of electrode plates; means for conducting a first bias energizing voltage to effect deflections in a first X direction; a second set of electrode plates, and means for conducting a second bias energizing voltage to effect deflections in a second X direction, said first set being spaced in essentially the X direction from said second set.

6. An actuator according to claim 1, further comprising electrode plates which extend essentially across electrodes of both the first and second set so as to interact with both first set and second set of electrode plates.

7. An actuator according to claim 1, wherein said actuator is of a general cylindrical form.

8. An actuator according to claim 1, wherein said actuator comprises at least one tunnel.

9. An actuator generally extending in the Z direction, comprising: a laminate of interleaved layers of electrode plates and piezoelectric material; a first region of electrode plates; means for energizing said first region to effect deflections in a first Y direction; a second region of electrode plates spaced in essentially the Y direction from said first region; means for energizing said second region to effect deflections in a second Y direction; at least one further region of electrode plates; means for energizing said further region to effect deflections in the X direction and at least one tunnel.

* * * * *